United States Patent [19]

Yanagisawa

[11] Patent Number: 4,736,344
[45] Date of Patent: Apr. 5, 1988

[54] SEMICONDUCTOR MEMORY

[75] Inventor: Kazumasa Yanagisawa, Kokubunji, Japan

[73] Assignee: Hitachi, Ltd., Tokyo, Japan

[21] Appl. No.: 843,612

[22] Filed: Mar. 25, 1986

[30] Foreign Application Priority Data

Mar. 25, 1985 [JP] Japan .................................. 60-58359

[51] Int. Cl.$^4$ ............................................. G11C 7/00
[52] U.S. Cl. ..................................... 365/222; 365/230
[58] Field of Search ................ 365/222, 230, 149, 189

[56] References Cited

U.S. PATENT DOCUMENTS 4,333,167  6/1982  McElroy ............................. 365/222
4,360,903 11/1982  Plachno et al. ..................... 365/222
4,376,988  3/1983  Ludwig et al. ..................... 365/222

FOREIGN PATENT DOCUMENTS 59-40394  3/1984  Japan .................................. 365/222

OTHER PUBLICATIONS

M. Taniguchi et al., "M 5K 4164S with Built-In Refresh Function", Denshi Gijutsu (Electronics Technology)" vol. 23, No. 3, pp. 30-33 (no publication date available).

Primary Examiner—Joseph A. Popek
Attorney, Agent, or Firm—Antonelli, Terry & Wands

[57] ABSTRACT

A refresh arrangement is provided for a dynamic RAM wherein each time a refresh address counter performs a predetermined plurality of steps of increment operations, an address switching circuit is switched to specified refresh addresses held in an address storage circuit to provide addresses of memory cells having inferior data retention times. In this way the memory cells with inferior data retention times can be refreshed much more frequently than memory cells with normal data retention times.

12 Claims, 3 Drawing Sheets

SEMICONDUCTOR MEMORY

BACKGROUND OF THE INVENTION

This invention relates to a semiconductor memory, and more particularly to a technique which is effective when utilized for a memory having a built-in refresh circuit, such as a dynamic RAM (random access memory)

The memory cells of a dynamic memory are constructed of storage capacitors for storing data in the form of charges, and MOSFETs for selecting addresses. In the memory cells formed on a semiconductor substrate, the charges stored in the capacitors decrease with time on account of leakage currents, etc. In order to keep accurate data stored in the memory cells, therefore, the so-called refresh operation needs to be performed in which the data items stored in the memory cells are read out before vanishing, and the read data items are amplified and then written into the same memory cells again. By way of example, an automatic refresh circuit described in a magazine "Denshi Gijutsu (Electronics Technology)", Vol. 23, No. 3, pp. 30–33 has been known as an automatic refresh system for memory cells in a dynamic RAM of 64 kbits. The contents thereof are as follows. The dynamic RAM is provided with an external terminal for refresh control This dynamic RAM is furnished with an auto-refresh function according to which a refresh control signal REF of predetermined level is applied to the external terminal, whereby a plurality of memory cells in the dynamic RAM are automatically refreshed. In addition, it includes a self-refresh function according to which the refresh signal REF is held at the predetermined level, whereby the refresh operation is performed every fixed cycle in accordance with an increment pulse formed on the basis of pulses provided by a built-in timer circuit.

Since such an automatic refresh circuit subjects all the memory cells to the refresh operation in the same cycle, a very short refresh cycle of approximately 2 ms is selected in consideration of the worst case. The dynamic RAM continues to perform refresh operations at such very short time intervals, so that the greater part of the power consumption thereof is ascribable to the refresh operations.

SUMMARY OF THE INVENTION

The inventor studied the data retention times of memory cells, and has found out that the data retention times of most memory cells are as long as approximately 400–1000 ms, whereas those of only a small number of limited memory cells worsen to several ms at random on account of process defects, etc. On the basis of this finding, the inventor has developed an arrangement to make the refresh cycles of memory cells unequal so as to correspond to the data retention times of the memory cells.

An object of this invention is to provide a semiconductor memory, for example, a dynamic RAM whose power consumption is lowered.

A further object of this invention is to provide a dynamic RAM having an improved refreshing arrangement which avoids unnecessary power consumption.

The aforementioned and other objects and novel features of this invention will become apparent from the description of the specification and the accompanying drawings A typical aspect of performance of this invention will be briefly summarized as follows. Each time a refreshing address counter executes an incremental operation consisting of a predetermined number of steps, a multiplexor is switched to specified refresh addresses held in an address storage circuit, thereby to frequently refresh memory cells which have inferior data retention times. Thus, these memory cells having inferior data retention times are refreshed several times for each time a normal memory cell is refreshed once.

DESCRIPTION OF THE PREFERRED EMBODIMENTS

Figure 1:
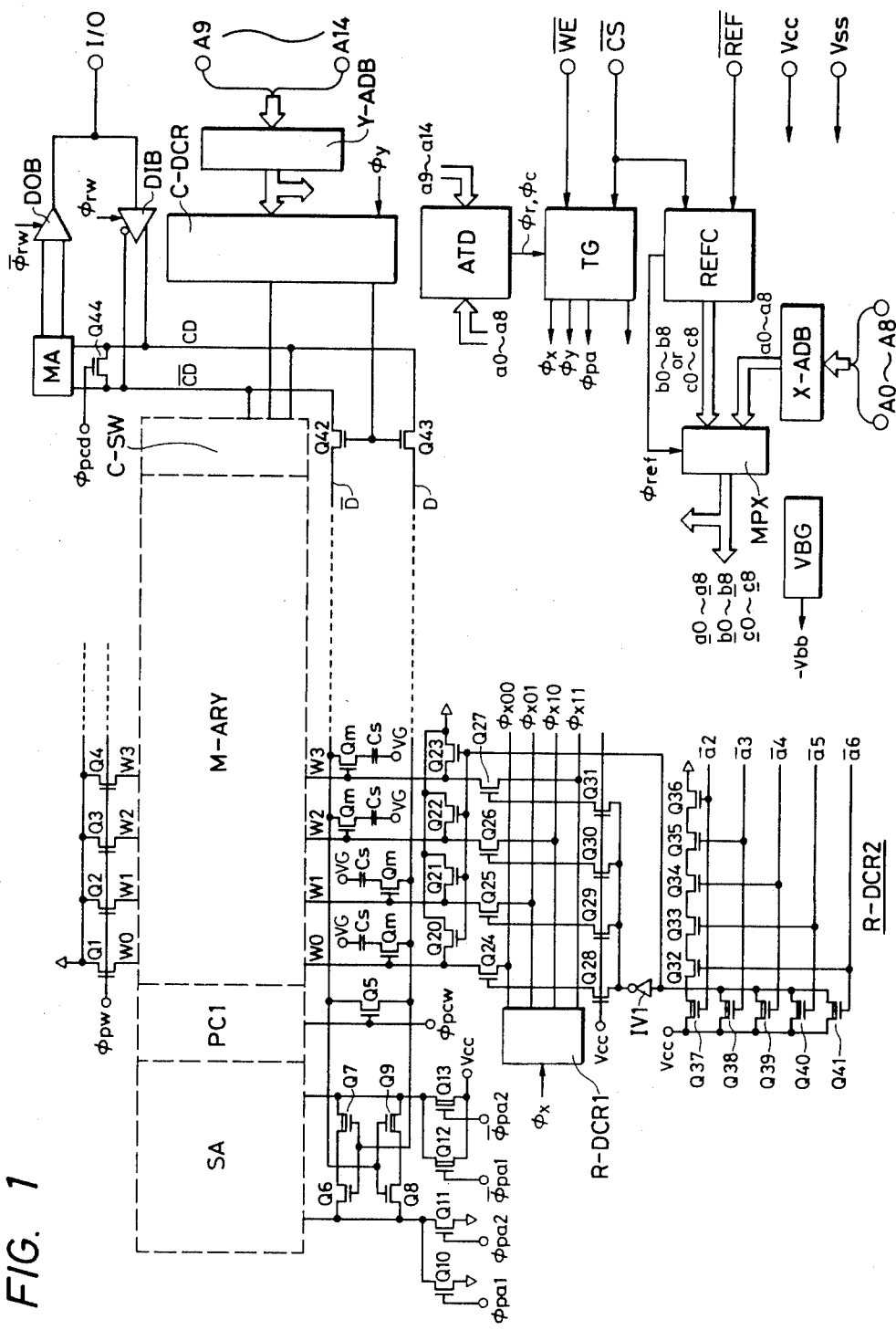
FIG. 1 is a circuit diagram showing a DRAM which is an embodiment of this invention.

FIG. 1 shows a circuit diagram of an embodiment of a dynamic RAM according to this invention. Various circuit elements in the figure are formed on a single semiconductor substrate of, e.g., single-crystal silicon by known processes for manufacturing a CMOS (complementary MOS) integrated circuit. In the ensuing description, MOSFETs (insulated-gate field effect transistors) are N-channel MOSFETs unless indicated otherwise. In the figure, each MOSFET which has a straight line added across the source and drain thereof is of the P-channel type.

Although not especially restricted, the integrated circuit of the embodiment is formed on a semiconductor substrate made of single-crystal P-type silicon. Each N-channel MOSFET is constructed of a source region and a drain region which are formed in the surface of such a semiconductor substrate, and a gate electrode of, e.g., polycrystalline silicon which is formed on the part of the surface of the semiconductor substrate between the source and drain regions through a thin gate insulator film. Each P-channel MOSFET is formed on an N-type well region which is formed in the surface of the semiconductor substrate. Thus, the semiconductor substrate constructs a body gate which is common to the plurality of N-channel MOSFETs formed on this semiconductor substrate. The N-type well region constructs the body gate of the P-channel MOSFET formed thereon. The body gate of the P-channel MOSFETs, namely, the N-type well region is coupled to a power source terminal $V_{cc}$ in FIG. 1.

A more specific description of the structure of the integrated circuit will be outlined below.

In the surface portion of the semiconductor substrate which is made of the single-crystal silicon of the P-conductivity type and which is formed with the N-type well region, parts other than surface parts which are used for active regions (in other words, parts other than surface parts which are used for semiconductor wiring regions, capacitor forming regions and the source, drain and channel (gate) forming regions of the N-channel and P-channel MOSFETs) are covered with a comparatively thick field insulator film which is formed by a known local oxidation method. A first layer of polycrystalline silicon is formed on the capacitor forming regions through a thin insulator film (oxide film). The first layer of polycrystalline silicon is extended onto the field insulator film. The surface of the first layer of polycrystalline silicon is formed with an oxide film which is produced by the thermal oxidation of the layer itself. In the parts of the semiconductor substrate surface corresponding to the capacitor forming regions, channels are formed by ion implantation, or channel regions are induced by applying a proper voltage such as power source voltage to the first layer of polycrystalline silicon. Thus, capacitors comprising the first layer of polycrystalline silicon, the thin insulator film and the channel regions are formed. The parts of the first layer of polycrystalline silicon overlying the field oxide film are regarded as a kind of wiring.

A second layer of polycrystalline silicon for forming gate electrodes is formed on the channel forming regions through a thin gate oxide film. The second layer of polycrystalline silicon is extended onto the field insulator film and the first layer of polycrystalline silicon. Though not especially restricted, word lines and dummy word lines in a memory array to be described later are constructed of the second layer of polycrystalline silicon.

In the surfaces of the active regions which are covered with none of the field insulator film and the first and second layers of polycrystalline silicon, the source, drain and semiconductor wiring regions are formed by a known impurity introducing technique which uses the film and the layers as a mask for impurity introduction.

A comparatively thick inter-layer insulator film is formed on the parts of the surface of the semiconductor substrate including the first and second layers of polycrystalline silicon. A conductor layer made of, e.g., aluminum is formed on the inter-layer insulator film. The conductor layer is electrically coupled to the polycrystalline silicon layers an the semiconductor regions through contact holes provided in the underlying insulator film. Though not especially restricted, data lines in the memory array to be described later are constructed of this conductor layer which is extended on the inter-layer insulator film.

The parts of the surface of the semiconductor substrate including the inter-layer insulator film and the conductor layer are covered with a final passivation film which is made up of, e.g., a silicon nitride film and a phosphosilicate glass film.

In FIG. 1, a substrate back-bias voltage generator circuit VBG generates a minus back-bias voltage $-V_{bb}$ to be supplied to the semiconductor substrate, in response to a plus supply voltage of, e.g., +5 V which is applied between the power source terminal $V_{cc}$ and a reference potential terminal or ground terminal $V_{ss}$ that constitute the external terminals of the integrated circuit. Thus, the back-bias voltage is applied to the body gate of the N-channel MOSFETs. As a result, the values of the parasitic capacitances between the sources and drains of the MOSFETs and the substrate are reduced, so that the operating speed of the circuit is increased.

Though not especially restricted, the memory array M-ARY is of the folded bit line configuration. In FIG. 1, one pair of rows of the memory array are concretely illustrated. Each memory cells comprises an address selecting MOSFET $Q_m$ and a data storing capacitor $C_s$. The input and output nodes of a plurality of memory cells are distributed with a predetermined regularity as shown in the figure and are coupled to a pair of complementary data lines D and $\overline{D}$ arranged in parallel.

A precharge circuit PCI is constructed of a switching MOSFET of the N-channel type interposed between the complementary data lines D and $\overline{D}$, as typically illustrated by a MOSFET Q5.

A sense amplifier SA is constructed of a CMOS latch circuit which comprises P-channel MOSFETs Q7 and Q9 and N-channel MOSFETs Q6 and Q8 typically illustrated, and one pair of input and output nodes of which are coupled to the complementary data lines D and $\overline{D}$. Though not especially restricted, the latch circuit is fed with the power source voltage $V_{cc}$ through P-channel MOSFETs Q12 and Q13 of parallel form and with the ground voltage $V_{ss}$ of the circuit through N-channel MOSFETs Q10 and Q11 of parallel form. The power switching MOSFETs Q10 and Q11 and MOSFETs Q12 and Q13 are used in common for latch circuits which are provided in other similar rows within an identical memory mat. In other words, the P-channel MOSFETs and N-channel MOSFETs in the latch circuits within the identical memory mat have their sources connected in common, respectively.

The gates of the MOSFETs Q10 and Q12 are respectively impressed with complementary timing pulses $\phi_{pa1}$ and $\overline{\phi}_{pa1}$ which activate the sense amplifier SA in an operating cycle, while the gates of the MOSFETs Q11 and Q13 are respectively impressed with complementary timing pulses $\phi_{pa2}$ and $\overline{\phi}_{pa2}$ which lag over the timing pulses $\phi_{pa1}$ and $\overline{\phi}_{pa1}$. In this way, the operation of the sense amplifier is divided in two stages. When the timing pulses $\phi_{pa1}$ and $\overline{\phi}_{pa1}$ have been generated, namely, at the first stage, a minute read-out voltage afforded across the pair of data lines from the memory cell is amplified without undergoing any undesirable level fluctuation, owing to the current limiting actions of the MOSFETs Q10 and Q12 having comparatively low conductances. When the timing pulses $\phi_{pa2}$ and $\overline{\phi}_{pa2}$ have been generated, namely, the second stage has begun after the difference between the potentials of the complementary data lines has been enlarged by the amplifying operation in the sense amplifier SA, the MOSFETs Q11 and Q13 having comparatively high conductances are brought into the "on" states. The amplifying operation of the sense amplifier SA is accelerated by the "on" states of the MOSFETs Q11 and Q13. Owing to the fact that the amplifying operation of the sense amplifier SA is carried out in the two divided stages in this manner, data can be read out at high speed while the undesirable level changes of the complementary data lines are being prevented.

Though not especially restricted, a row decoder R-DCR is constructed of the combination of row decoders R-DCRI and R-DCR2 divided in two. In the figure, one circuit unit (corresponding to four word lines) of the second row decoder R-DCR2 is typically illustrated. According to the depicted arrangement, a word line select signal for the four word lines is formed by a NAND circuit being a CMOS circuit which is constructed of N-channel MOSFETs Q32–Q36 and P-channel MOSFETs Q37–Q41 that receive address signals $\bar{a}_2$–$\bar{a}_6$ by way of example. The output of the NAND circuit is inverted by a CMOS inverter IVI, and is then transmitted to the gates of N-channel type transfer gate MOSFETs Q24–Q27 as switching circuits through N-channel type cutting MOSFETs Q28–Q31.

While the first row decoder R-DCR1 does not have its practicable circuit illustrated, it forms four word line select timing signals $\phi_{x00}$-$\phi_{x11}$ from a word line select timing signal $\phi_x$ through switching circuits which are constructed of transfer gate MOSFETs and cutting MOSFETs similar to the above and which are selected by decode signals formed of 2-bit complementary address signals $a_0$, $\bar{a}_0$ and $a_1$, $\bar{a}_1$. The word line select timing signals $\phi_{x00}$-$\phi_{x11}$ are transmitted to the corresponding word lines through the transfer gate MOSFETs Q24-Q27.

Though not especially restricted, the timing signal $\phi_{x00}$ is brought to a high level in synchronism with the timing signal $\phi_x$ when the address signals $a_0$ and $a_1$ are held at a low level. Likewise, the timing signals $\phi_{x01}$, $\phi_{x10}$, and $\phi_{x11}$ are respectively brought to the high level in synchronism with the timing signal $\phi_x$ when the address signals $\bar{a}_0$ and $a_1$, $a_0$ and $\bar{a}_1$, and $\bar{a}_0$ and $\bar{a}_1$ are held at the low level.

Thus, the address signals $a_1$ and $\bar{a}_1$ are regarded as a kind of word line group select signals for discriminating among the plurality of word lines, a group of word lines (W0 and W1, hereinbelow termed the "first word line group") corresponding to the memory cells coupled to the data line D and a group of word lines (W2 and W3, hereinbelow termed the "second word line group") corresponding to the memory cells coupled to the data line $\bar{D}$.

By dividing the row decoder in two as the row decoders R-DCR1 and R-DCR2, the pitch (interval) of the row decoder R-DCR2 and the pitch of the word lines can be equalized As a result, space is not wasted on the semiconductor substrate. MOSFETs Q20-Q23 are interposed between the respective word lines and the ground potential. The output of the NAND circuit is applied to the gates of the MOSFETs Q20-Q23, whereby the word lines in unselected states are fixed to the ground potential.

Though not especially restricted, the word lines are provided with resetting MOSFETs Q1-Q4 at the remote end side thereof (the ends thereof opposite to the decoder side). The MOSFETs Q1-Q4 fall into the "on" states upon receiving a reset pulse $\phi_{pw}$, whereby the selected word line is reset to the ground level from both the ends thereof. The row-group address signals $a_7$ ($a_7$ and $\bar{a}_7$) and $a_8$ ($a_8$ and $\bar{a}_8$) of the remaining 2 bits are utilized as the switch signals (select signals) of mats (a memory array similar to the above, divided in a plurality of parts).

A row address buffer X-ADB receives (row) address signals supplied from external terminals A0-A8, and it forms internal address signals $a_0$-$a_8$ inphase with the address signals supplied from the external terminals and supplies them to a multiplexor to be described later.

A column switch C-SW selectively couples the complementary data lines D and $\bar{D}$ and common complementary data lines CD and $\overline{CD}$ as typically illustrated by MOSFETs Q42 and Q43. The gates of these MOSFETs Q42 and Q43 are fed with a select signal from a column decoder C-DCR.

The column decoder C-DCR has the column select timing thereof controlled by a data line select timing signal $\phi_y$. At a predetermined column select timing, the column decoder C-DCR decodes internal address signals $a_9$-$a_{14}$ and antiphase internal address signals $\bar{a}_9$-$\bar{a}_{14}$ supplied from a column address buffer Y-ADB, thereby to form the select signal which is to be supplied to the column switch C-SW.

The column address buffer Y-ADB receives (column) address signals supplied from external terminals A9-A14, and it forms the internal address signals $a_9$-$a_{14}$ inphase with and the internal address signals $\bar{a}_9$-$\bar{a}_{14}$ antiphase to the address signals supplied from the external terminals (hereinbelow, both the internal address signals shall be collectively expressed as $a_9$-$a_{14}$) and supplies them to the column decoder C-DCR. Likewise, $a_0$-$a_8$ shall indicate the internal address signals $a_0$-$a_8$ and the internal address signals $\bar{a}_0$-$\bar{a}_8$ antiphase thereto.

A precharge MOSFET Q44 of the N-channel type which constructs a precharge circuit is interposed between the common complementary data lines CD and $\overline{CD}$. One pair of input and output nodes of a main amplifier MA having a circuit arrangement similar to that of the sense amplifier SA is coupled to the common complementary data lines CD and $\overline{CD}$.

In a reading operation, a data output buffer DOB is brought into an operating state by the timing signal $\phi_{rw}$ thereof, and it amplifies the output signal of the main amplifier and then sends it from an external terminal I/O. In a writing operation, the output of the data output buffer DOB is brought into a high impedance state by the timing signal $\phi_{rw}$. In the writing operation, a data input buffer DIB is brought into an operating state by the timing signal $\phi_{rw}$ thereof, and it transmits complementary write signals conforming to a write signal supplied from the external terminal I/O, to the common complementary data lines CD and $\overline{CD}$. Thus, data is written into the selected memory cell. Besides, in the reading operation, the output of the data input buffer DIB is brought into a high impedance state by the timing signal $\phi_{rw}$.

In the writing operation into the dynamic type memory cell which comprises the address selecting MOSFET $Q_m$ and the data storing capacitor $C_s$ as described above, in order to effect full write into the data storing capacitor $C_s$, in other words, in order to prevent the level loss of a write high level into the data storing capacitor $C_s$ from occurring due to the threshold voltages of the address selecting MOSFET $Q_m$, etc., a word line bootstrap circuit (not shown) which is started by the word line select timing signal $\phi_x$ is provided. Using the word line select timing signal $\phi_x$ and the delayed signal thereof, the word line bootstrap circuit renders the high level of the word line select timing signal $\phi_x$ a high level in excess of the power source voltage $V_{cc}$.

The various timing signals stated above are formed by the following circuit blocks.

Shown by a circuit symbol ATD is an address signal transition detector which, though not especially restricted, receives the address signals $a_0$-$a_8$ (or $\bar{a}_0$-$\bar{a}_8$) and address signals $a_9$-$a_{14}$ (or $\bar{a}_9$-$\bar{a}_{14}$) and detects the transitions of the rises or falls thereof. Though not especially restricted, the address signal transition detector ATD is constructed of exclusive -OR circuits which receives the address signals $a_0$-$a_8$ and the delayed signals thereof respectivley, an AND circuit which receives the output signals of the exclusive-OR circuits, and similar circuits which receive the address signals $a_9$-$a_{14}$. That is, the exclusive circuits which receive the address signals and the delayed signals of these address signals are provided for the respective address signals. When any of the address signals $a_0$-$a_8$ has changed, the address signal transition detector ATD forms an address signal transition detection pulse $\phi_r$ of the row group synchronous with the timing of the change. Likewise, when any of the address signals $a_9$-$a_{14}$ has changed, an address signal transition detection pulse $\phi_c$ of the column group is formed.

Shown by a circuit symbol TG is a timing generator, which forms the principal timing signals typically indicated above. That is, the timing generator TG receives a write enable signal $\overline{WE}$ and a chip select signal $\overline{CS}$ supplied from external terminals, in addition to the address signal transition detection pulses $\phi_r$ and $\phi_c$, to form the series of timing pulses.

A circuit symbol REFC denotes an automatic refresh circuit, which includes refresh address counters, a timer, etc., not shown. The automatic refresh circuit REFC is started by bringing a refresh signal $\overline{REF}$ from an external terminal into the low level. More specifically, when the refresh signal $\overline{REF}$ is brought to the low level with the chip select signal CS held at the high level, the automatic refresh circuit REFC is responsively brought into an operating state. Then, the circuit REFC supplies the multiplexor MPX with a control signal $\phi_{ref}$ which causes the multiplexor to transmit internal address signals $b_0$-$b_8$ from the refresh address counters CT1 and CT2 (to be described later) within the circuit REFC to the row decoder R-DCR. Thus, a refresh operation (auto-refresh) based on the selection of one word line corresponding to the internal address signals is executed. In addition, when the refresh signal REF is held at the low level, the timer operates, and the refresh address counters (CT1, CT2) are incremented every fixed period of time, so successive refresh operations (self-refresh) are executed meantime.

For the purpose of lengthening a substantial refresh cycle to attain a low power consumption, the automatic refresh circuit REFC is furnished with an address setting function which affords a first refresh cycle for most memory cells of long data retention times and a second refresh cycle for memory cells of short data retention times.

While the details will be described later, the address signals $b_0$-$b_8$ (formed of address signals $b_0$-$b_8$ and inverted signals $\overline{b_0}$-$\overline{b_8}$) are used as addresses for refreshing the memory cells having the long data retention times (400–1000 ms). On the other hand, address signals $c_0$-$c_8$ are supplied to the multiplexor MPX in accordance with the output of a counter CT3 (to be described later) within the circuit REFC. The address signals $c_0$-$c_8$ (formed of address signals $c_0$-$c_8$ and inverted signals $\overline{c_0}$-$\overline{c_8}$) are used as addresses for refreshing the memory cells having the short data retention times (several ms). The multiplexor MPX transmits either the address signals $b_0$-$b_8$ or those $c_0$-$c_8$ to the row decoder R-DCR in the refresh operation. When the refresh operation is not in process, MPX will transmit address signals $a_0$-$a_8$.

Figure 2:
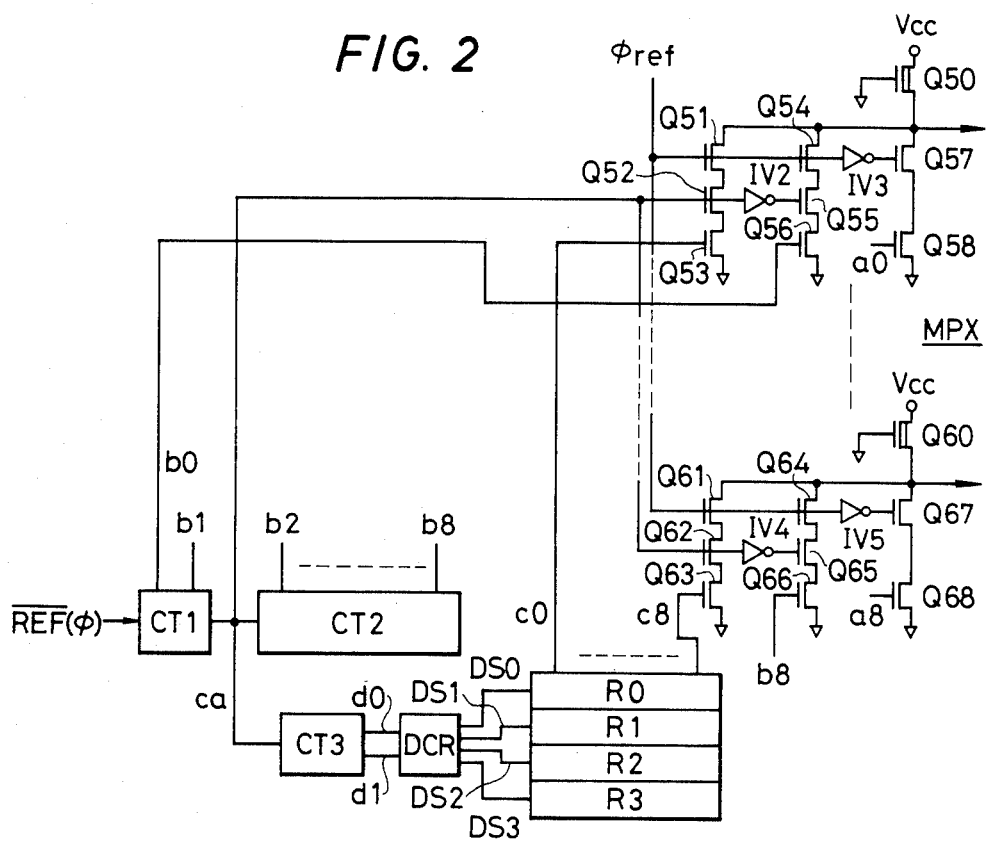
FIG. 2 is a circuit diagram showing an embodiment of a refresh control circuit as well as a multiplexor in the DRAM of FIG. 1.

One example of means for realizing the aforementioned function is illustrated in FIG. 2. Shown in this figure is a circuit diagram of one embodiment of the automatic refresh circuit REFC as well as the multiplexor MPX.

Though not especially restricted, the address counter for forming the address signals for refresh is constucted of two counter circuits CT1 and CT2 put in a cascade form. The first counter circuit CT1, the input of which is supplied with the refresh control signal $\overline{REF}$ fed from the external terminal or an increment pulse $\phi$ formed on the basis of pulses output from a timer circuit not shown, is a divided-by-5 counter circuit using a 3-bit counter, though not especially restricted. The least significant bit $b_0$ and the next bit $b_1$ of this counter circuit CT1 are used as refresh address signals corresponding to the address signals $A_0$-$A_1$ of 2 bits among the address signals $A_0$-$A_8$, and the remaining signal of the most significant bit is supplied to the input of the second counter CT2 as a carry signal ca. This binary counter circuit CT2 of 7 bits forms the address signals $b_2$-$b_8$ corresponding to the remaining bits among the address signals $A_0$-$A_8$ of the row group. This embodiment is characterized in that the least significant bit $b_2$ of the counter circuit CT2 is fed with the carry signal ca, not the address signal $b_1$ of the directly preceding bit. The address signals $b_0$-$b_8$ are supplied to the multiplexor MPX to be described later.

The signal of the most significant bit of the first counter circuit CT1, namely, the carry signal ca is utilized, on the other hand, for the refresh operation of the memory cells whose data retention times are short. Though not especially restricted, the carry signal ca is supplied to the input of a third counter circuit as a part of an address switching circuit This counter circuit CT3 is a divided-by-4 counter circuit The 2-bit output signals $d_0$-$d_1$ of the binary counter circuit CT3 are transformed into four select signals $DS_0$-$DS_3$ by a decoder circuit DCR.

The select signals $DS_0$-$DS_3$ are used as the select signals of storage circuits for designating the addresses of the word lines to which the memory cells of the short data retention times are coupled. Prepared as the address storage circuits are storage circuits $R_0$-$R_3$ which store address signals for designating the addresses of the word lines numbering four. The select signals $DS_0$-$DS_3$ are respectively input to the storage circuits R0-R3.

Figure 3:
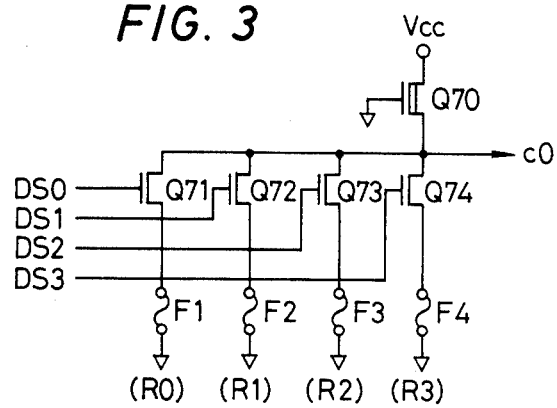
FIG. 3 is a circuit diagram showing an embodiment of an address storage circuit in the DRAM of FIG. 1.

FIG. 3 shows an example of a practicable circuit corresponding to 1 bit (signal $c_0$) of the storage circuits R0-R3. The other bits (signals $c_1$-$c_8$) are similarly arranged. Referring to the figure, the select signals $DS_0$-$DS_3$ are supplied to the gates of N-channel MOSFETs Q71-Q74. Fuse means F1-F4, which are made of polycrystalline silicon layers, though not especially restricted, are respectivley disposed between the sources of the MOSFETs Q71-Q74 and the ground potential point of the circuit. The drains of the MOSFETs Q71-Q74 are made common, and a P-channel MOSFET Q70 as load means is provided. That is, in the storge circuit R0, a unit circuit for outputting the signal $c_0$ is constructed of the MOSFET Q71 and the fuse F1. The signal $c_0$ to be provided when each of the storage circuits R1-R3 is selected is formed by a unit circuit similarly arranged. The fuse means F1-F4 have their resistance values changed or are fused by annealing which employs a laser beam by way of example, in accordance with the addresses of the word lines to which the memory cells having the short data retention times are coupled. The select signals $DS_0$-$DS_3$ are alternatively brought to the high level. Thus, only the MOSFETs of any selected storage circuit are brought into the "on" states. As a result, the address signal $c_0$ of the high level/low level conforming to, e.g., the presence or absence of the fusion of the fuse means of the selected storage circuit is transmitted. Likewise, the signals $c_1$-$c_8$ are output from each of the storage circuits R0-R3 selected by the signals $DS_0$-$DS_3$.

Since, in this embodiment, the four sets of storage circuits R0-R3 are provided as shown in FIG. 2, the memory cells of the short data retention times coupled with up to four word lines can be refreshed. As described above, the select signals $DS_0$-$DS_3$ function to selectively transmit the address signals held in the respectivley corresponding storage circuits R0-R3. The address signals $c_0$–$c_8$ alternatively output in this way are supplied to the succeeding multiplexor MPX.

FIG. 2 shows a first portion of the multiplexor MPX which operates as a part of an address switching circuit to select and output any of the address signals $a_0$–$a_8$, signals $b_0$–$b_8$ and signals $c_0$–$c_8$. The unit circuit of FIG. 2 in the multiplexor MPX which selectively transmits the signals for one bit is constructed of the following circuit elements A P-channel MOSFET Q50 is operated as a load resistor in such a way that the gate thereof is steadily supplied with the ground potential of the circuit. The source of this MOSFET Q50 is coupled to the power source voltage $V_{cc}$. The MOSFET Q50 is used as the common load means of N-channel type drive MOSFETs in three series forms to be stated below. By the way, this unit circuit is a circuit for the internal address signals $a_0$, $b_0$ and $c_0$ corresponding to the address signal $A_0$.

One series circuit is composed of N-channel MOSFETs Q57 and Q58. The gate of the MOSFET Q57 is supplied with the output signal of an inverter circuit IV3 which receives the refresh control signal $\phi_{ref}$, while the gate of the MOSFET Q58 is supplied with the address signal $a_0$ which is sent from the address buffer X-ADB. The other two series circuits are respectively composed of MOSFETs Q51, Q52 and Q53 and MOSFETs Q54, Q55 and Q56. The gates of the MOSFETs Q51 and Q54 are supplied with the refresh control signal $\phi_{ref}$ in common. The gate of the MOSFET Q52 of one of the above two series circuits is supplied with the carry signal ca, while the gate of the MOSFET Q53 is supplied with the address signal $c_0$ from the storage circuit. In addition, the gate of the MOSFET Q55 of the other of the above two series circuits is supplied with the output signal of an inverter circuit IV2 which receives the carry signal ca, while the gate of the MOSFET Q56 is supplied with the address signal $b_0$ which is formed by the refresh address counter circuit.

Another unit circuit typically illustrated, corresponding to the most significant bit ($A_8$) is constructed of MOSFETs Q60–Q68 similar to the above.

Figure 4:
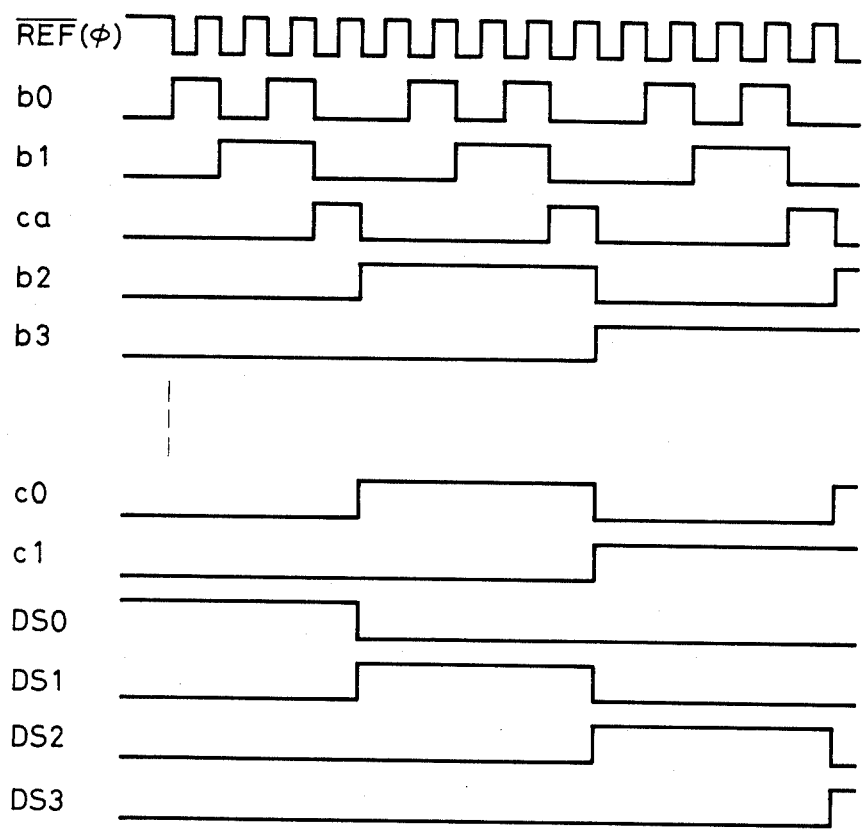
FIG. 4 is a timing chart for explaining the refresh operation of the DRAM of FIG. 1.

Next, the refresh operation according to this invention will be described with reference to a timing chart shown in FIG. 4.

In an unshown case where the circuit is not in the refresh operation, the low level of the control signal $\phi_{ref}$ turns "off" the MOSFETs Q51 and Q54 (Q61 and Q64) of the multiplexor MPX and turns "on" the MOSFET Q57 (Q67) thereof. Thus, the multiplexor MPX transmits the address signals $a_0$–$a_8$ and does not transmit the signals $b_0$–$b_8$ or $c_0$–$c_8$.

On the other hand, in the refresh operation, the refresh signal $\overline{REF}$ which is supplied to the external terminal is brought to the low level for a comparatively short time or is held continuously at the low level, as stated before, whereby the increment pulse $\phi$ is formed. At this timing, the refresh control signal $\phi_{ref}$ is brought to the high level and switches the multiplexor MPX to the refresh addresses. That is, since the output signal of the inverter circuit IV3 of the multiplexor MPX is made the low level by the high level of the refresh control signal $\phi_{ref}$, the MOSFETs Q57 and Q67 are brought into the "off" states. Thus, the delivery of the address signals $a_0$–$a_8$ sent from the address buffer X-ADB is inhibited. At this time, the MOSFETs Q51 and Q54, Q61 and Q64, etc., of the multiplexor MPX are brought into the "on" states by the high level of the refresh control signal $\phi_{ref}$.

If the carry signal ca is at the low level, the MOSFETs Q52, Q62, etc., are brought into the "off" states, and the MOSFETs Q55, Q65, etc., are brought into the "on" states. Thus, the multiplexor MPX delivers the refresh address signals $b_0$–$b_8$ supplied to the gates of the MOSFETs Q56, Q66, etc. In contrast, if the carry signal ca is at the high level as will be described later, the MOSFETs Q52, Q62, etc., are switched into the "on" states, and the MOSFETs Q55, Q65, etc., are switched into the "off" states. Thus, the multiplexor MPX delivers the refresh address signals $c_0$–$c_8$ supplied to the gates of the MOSFETs Q53, Q63, etc., and sent from the storage circuit. That is, when the signal ca is at the low level and the high level, the memory cells of the long data retention times and the memory cells of the short data retention times are respectively refreshed.

The counter circuit CT1 performs a counting operation in synchronism with the fall of the increment pulse $\phi$ thereof. Since the signal of the most significant bit of this counter circuit CT1 is made the carry signal ca and is supplied to the input of the counter circuit CT2 of the succeeding stage, this counter circuit CT2 performs an increment operation every fall thereof. Thus, as viewed from the increment pulses $\phi$, the increment operation of the first refresh address signals $b_0$–$b_8$ which are formed by the counter circuits CT1 and CT2 is interrupted at the proportion of one among five.

When the increment operation has been interrupted, in other words, at the timing at which the carry signal ca has been brought to the high level, the multiplexor MPX is switched as described above and is caused to deliver the address signals $c_0$–$c_8$ held in the storage circuit, which is designated by one of the select signals $DS_0$–$DS_3$ formed by decoding the output signals of the counter circuit CT3. Further, when the carry signal ca has changed from the high level to the low level, the increment operation of the counter circuit CT3 is performed, and the next select signal is formed.

Owing to such operations, the increment operation of the refresh address signals $b_0$–$b_8$ is performed by the four increment pulses among the five increment pulses, and the stored address signals $c_0$–$c_8$ are delivered by the remaining one increment pulse. That is, one round of refresh cycles of this embodiment does not consist of 512 ($=4\times128$) cycles but consists of $5\times128=640$ cycles in the case where the address signals are of 9 bits, as described above. In the 640 cycles, the refresh for the four word lines to which the memory cells having the short data retention times are coupled is executed 128 times in all. Namely, each word line is refreshed 32 times. That is, the memory cells having short data retention times are subjected to 32 refresh operations during the period when one refresh operation is executed for the normal memory cells (i.e. those having the long data retention times).

Regarding the above-discussed multiplexor operation, it should be noted that the multiplexor MPX in this embodiment will include a second portion (not shown) which will receive the selected 9-bit signals $a_0$–$a_8$, $b_0$–$b_8$ or $c_0$–$c_8$ and produce inverted signals therefor so that the actual output of MPX to the row decoder will be the 18-bit signals $\underline{a_0}$–$\underline{a_8}$, $\underline{b_0}$–$\underline{b_8}$ or $\underline{c_0}$–$\underline{c_8}$ illustrated in FIG. 1.

When the refresh address signals have changed as described above, the address signal transition detection pulses $\phi_r$ and $\phi_c$ are formed by the address signal transition detector ATD.

The timing generator TG resets the selection circuit of the memory array M-ARY in synchronism with the address signal transition detection pulses $\phi_r$ and $\phi_c$. That is, the sense amplifier Sa is brought into the non-operating state by the timing pulses $\phi_{pa1}$ and $\phi_{pa2}$ ($\overline{\phi}_{pa1}$, $\overline{\phi}_{pa2}$), to bring the complementary data lines D and $\overline{D}$ to the high level and low level of a floating state conforming to previous read or written data. In addition, the word line select timing signal $\phi_x$ and the data line select signal $\phi_y$ are brought to the low level, to bring the respective decoders into the non-operating states. Thereafter, a precharge pulse $\phi_{pcw}$ is brought to the high level to short-circuit the complementary data lines, whereby the half precharge operation as stated before is carried out. After the end of this precharge operation, the word line select timing signal $\phi_x$ is brought to the high level to select the word line in accordance with the received address signals. Subsequently, the sense amplifier SA is brought into the operating state by the timing pulses $\phi_{pa1}$ and $\phi_{pa2}$ ($\overline{\phi}_{pa1}$, $\overline{\phi}_{pa2}$), to amplify the stored data of the memory cell read out to the complementary data lines D and $\overline{D}$ and to transmit it to these complementary data lines D and $\overline{D}$. Charges as the stored data of the memory cell which was once about to be destroyed by the word line selecting operation are restored by directly receiving the amplified levels of the complementary data lines D and $\overline{D}$. The stored data of the memory cell is refreshed by such operations.

In a reading or writing operation, the column decoder C-DCR forms a select signal conforming to the data line select timing signal $\phi_y$ and supplies it to the column switch C-SW. thus, one pair of data lines D and $\overline{D}$ and the common complementary data lines CD and $\overline{CD}$ are coupled, so that data conforming to the levels of the coupled data lines D and $\overline{D}$ appears on the common complementary data lines CD and $\overline{CD}$. In the reading operation, read signals read out to the common complementary data lines CD and $\overline{CD}$ are amplified by the main amplifier MA. The data output buffer DOB is brought into the operating state by the high level of the timing pulse $\phi_{rw}$, to deliver a read output $D_{out}$ from the external terminal I/O. In the writing operation, the write signals of the high level and low level supplied through the data input buffer DIB, which has been brought into the operating state by the high level of the timing pulse $\phi_{rw}$, are written into the memory cell through the common complementary data lines CD, $\overline{CD}$, the column switch MOSFETs Q42, Q43 and the complementary data lines D, $\overline{D}$. (The above is not illustrated.)

In the refresh operation described above, when the period of time necessary for one round consisting of 640 cycles is set at 64 ms by way of example, a refresh period for the normal memory cells is made 64 ms, and a refresh period for the memory cells having the short data retention times is made 2 ms which is 1/32 of the former refresh period.

In this way, the number of times of refresh can be sharply diminished as compared with that in the case of refreshing all the memory cells with the same period of 2 ms as in the prior art, and a lower power consumption can be attained accordingly.

According to the present invention, the following effects are produced:

(1) The refresh of memory cells having short data retention times is repeatedly inserted in a skipping manner into refresh cycles, whereby a refresh period as a whole can be lengthened. This makes it possible to sharply decrease the number of times a normal memory cell is refreshed, and therefore brings forth the effect that the sharp reduction of power consumption can be achieved.

(2) A divided-by-$(2^n-1)$ counter circuit is employed as a circuit which provides the refresh periods of memory cells of short data retention times repeatedly in a skipping manner in refresh cycles, and the most significant bit thereof is utilized. This brings forth the effect that two kinds of refresh periods can be created by the simple circuit.

(3) By properly setting one of two kinds of refresh periods, it is possible to prevent memory cells of very short data retention times from being treated as defective bits.

(4) Owing to Item (3), the available percentage of products of a semiconductor memory is enhanced.

(5) It is possible to prolong the period of time during which a memory can be accessed.

While, in the above, the invention made by the inventor has been concretely described in conjunction with embodiments, it is needless to say that this invention is not restricted to the foregoing embodiments but is variously alterable within a scope not departing from the purport therof.

By way of example, for the purpose of storing the address signals $c_0$–$c_8$ for N word lines, it is also allowed to form the divided-by-N counter CT3 and to form the storage circuits numbering N.

The counter CT1 may well be a divided-by-9 ($=2^3+1$) counter. At this time, the counter CT1 delivers the signals $b_0$–$b_2$.

In the embodiment described above, the inverted portions of the internal complementary address signals $a_0$–$a_8$, $b_0$–$b_8$ and $c_0$–$c_8$ are formed by the second portion (not shown) of the multiplexor. However, the complementary signals $a_0$–$a_8$ may be obtained directly from the row address buffer $\overline{X}$-ADB to be supplied to the multiplexor MPX. In this case, the other address signals $b_0$–$b_8$ and $c_0$–$c_8$ are also supplied to the multiplexor MPX in the forms of the complementary signals $\overline{b_0}$–$\overline{b_8}$ and $\overline{c_0}$–$\overline{c_8}$. With this measure, the multiplexor $\overline{MPX}$ can be simplified and the semiconductor memory can be very high in its operating speed.

Although the circuit is somewhat complicated, the multiplexor MPX should desirably have the occurrence of direct current prevented by employing a CMOS circuit which is brought into the operating state or the high output impedance state by, for example, the control signal described before. In addition, the circuit for creating the skipping refresh periods in the refresh cycles may be any circuit. The address storing circuit may be any other than the circuit including the fuse means, for example, a circuit in which MOSFETs have their gates broken down selectively.

The practicable circuit arrangements of the other peripheral circuits constituting the dynamic RAM can take various aspects of performance. By way of example, the address signals may well be supplied from common address terminals in multiplexed fashion in synchronism with address strobe signals $\overline{RAS}$ and $\overline{CAS}$. As a refresh starting system in this case, it is possible to take various aspects of performance, such as a system wherein the column address strobe signal $\overline{CAS}$ is brought to the low level prior to the row address strobe signal $\overline{RAS}$ (CBR). Besides, the reference voltage for the reading operation of the memory cell may well be formed by utilizing a dummy cell.

The present invention is especially effective when the capacitor of a memory cell is a MIS (Metal-Insulator-Semiconductor) type capacitor which has as its one electrode formed by a semiconductor substrate or a semiconductor region formed therein. However, whatever structure the capacitor may have, the present invention is applicable.

This invention can be extensively utilized for semiconductor memories, e.g., a dynamic RAM, having built-in refresh circuits.

I claim:

1. A semiconductor memory provided with a refresh control circuit for periodically refreshing memory cells of said semiconductor memory, wherein said refresh control circuit comprises:

an address counter circuit including means for performing a plurality of steps of increment operations to form refresh address signals for a first group of said memory cells;

an address storage circuit which stores specified refresh addresses for a second group of said memory cells; and an address switching circuit coupled to said address counter circuit and said address storage circuit, said address switching circuit including means for outputting the refresh address signals from said address counter circuit during a predetermined plurality of said increment operations and for outputting the specified refresh addresses held in said address storage circuit each time said address counter has performed said predetermined plurality of steps of increment operations.

2. A semiconductor memory according to claim 1, wherein said address counter circuit comprises a first counter circuit including a divided-by-$(2^n+1)$ counter (where n is an integral number greater than or equal to 1) which receives an increment pulse, and a second counter circuit which receives an output signal of the most significant bit of said first counter circuit, wherein the refresh address signals are formed by output signals of respective bits of said first counter circuit, except the most significant bit thereof, and output signals of respective bits of said second counter circuit, and wherein a control signal to be supplied to said address switching circuit is formed on the basis of the output of the most significant bit of said first counter circuit.

3. A semiconductor memory according to claim 1, wherein said address storage circuit stores the specified refresh addresses by selectively cut fuse means.

4. A semiconductor memory comprising:
a plurality of memory cells;
first means for repeatedly refreshing memory cells of specified addresses in accordance with a first refresh period; and
second means for repeatedly refreshing memory cells except those to be refreshed with the first period in accordance with a second refresh period which is longer than the first refresh period.

5. A semiconductor memory according to claim 4, wherein the first means includes means for carrying out the refresh with the first refresh period a plurality of times in a time interval in which the refresh by the second means with the second refresh period is performed once.

6. A semiconductor memory including a plurality of memory cells arranged in an array, wherein a first group of said memory cells has data retention times less than a predetermined time, and wherein a second group of said memory cells has data retention times greater than said predetermined time period, wherein said semiconductor memory includes a refresh circuit comprising:

an address counter circuit including means for performing a plurality of steps of increment operation to form refresh address signals for said second group of memory cells so that each of said memory cells of said second group is refreshed in accordance with a first refresh period which is greater than said predetermined time period;

an address storage circuit which stores addresses of said first group of memory cells; and an address switching circuit coupled to said address counter circuit and to said address storage circuit, said address switching circuit including means for outputting the refresh address signals from said address counter circuit during a predetermined plurality of steps of increment operation to refresh memory cells within said second group of memory cells and for outputting the stored addresses of said first group of memory cells each time said address counte circuit has performed said predetermined plurality of steps of increment operation so that said memory cells of said first group of memory cells are refreshed in accordance with a second refresh period which is shorter in time than said predetermined time period.

7. A semiconductor memtory including a plurality of memory cells arranged in an array, wherein each of said memory cells includes capacitor means for storing data, wherein a first group of said memory cells has a data retention time period which is less than a predetermined time period, and wherein a second group of said memory cells has a data retention time period which is greater than said predetermined time period, said semiconductor memory comprising:

row selecting means coupled to said array and responsive to address signals for selecting memory cells indicated by the address signals from said plurality of memory cells; and a refresh circuit coupled to said row selecting means and for generating the address signals which indicate a memory cell to be refreshed, wherein said refresh circuit includes first refresh means for forming the address signals for said second group so that each of memory cells of said second group is refreshed in accordance with a first refresh period which is greater than said predetermined time period, and second refresh means for forming the address signals for said first group so that each of memory cells of said first group is refreshed in accordance with a second refresh period which is shorter in time than said predetermined period.

8. A semiconductor memory according to claim 7, wherein said second refresh means includes a storage circuit for storing address signals which indicate the memory cells of said first group and means for forming the address signals of said second refresh means on the basis of the stored address signals in said storage circuit.

9. A semiconductor memory according to claim 8, wherein said refresh circuit further includes switching means which receives the address signals of said first refresh means and the address signals of said second refresh means and outputs the address signals of said refresh circuit.

10. A semiconductor memory according to claim 9, further comprising an address circuit which generates input address signals, and a switching circuit which is coupled to said address circuit, to said refresh circuit and to said row selecting means, and which transfers either the input address signals or the address signals of said refresh circuit to said row selecting means.

11. A semiconductor memory according to claim 7, wherein said refresh circuit further includes switching means which receives the address signals of said first refresh means and the address signals of said second refresh means and outputs the address signals of said refresh circuit.

12. A semiconductor memory according to claim 11, further comprising an address circuit which generates input address signals, and a switching circuit which is coupled to said address circuit, to said refresh circuit and to said row selecting means, and which transfers either the input address signals or the address signals of said refresh circuit to said row selecting means.

* * * * *